(12) United States Patent
Eberlein et al.

(10) Patent No.: US 8,335,962 B2
(45) Date of Patent: Dec. 18, 2012

(54) INTERLEAVER APPARATUS AND RECEIVER FOR A SIGNAL GENERATED BY THE INTERLEAVER APPARATUS

(75) Inventors: Ernst Eberlein, Grossen-Seebach (DE); Marco Breiling, Erlangen (DE); Cedric Keip, Erlangen (DE); Holger Stadali, Erlangen (DE); Albert Heuberger, Erlangen (DE)

(73) Assignee: Fraunhofer-Gesellschaft zur Foerderung der Angewandten Forschung e.V., Munich (DE)

( * ) Notice: Subject to any disclaimer, the term of this patent is extended or adjusted under 35 U.S.C. 154(b) by 1013 days.

(21) Appl. No.: 12/303,555

(22) PCT Filed: Jun. 5, 2007

(86) PCT No.: PCT/EP2007/004998
§ 371 (c)(1),
(2), (4) Date: Dec. 15, 2008

(87) PCT Pub. No.: WO2007/140998
PCT Pub. Date: Dec. 13, 2007

(65) Prior Publication Data
US 2010/0235706 A1 Sep. 16, 2010

(30) Foreign Application Priority Data
Jun. 9, 2006 (DE) .......................... 10 2006 026 895

(51) Int. Cl.
*G06F 11/00* (2006.01)

(52) U.S. Cl. ..................................................... 714/755
(58) Field of Classification Search ........... 714/755–756
See application file for complete search history.

(56) References Cited

U.S. PATENT DOCUMENTS
5,159,608 A 10/1992 Falconer et al.
(Continued)

FOREIGN PATENT DOCUMENTS
EP 844 741 A2 5/1998
(Continued)

OTHER PUBLICATIONS
Official Communication issued in corresponding Russian Patent Application No. 2008152401/09(069069), mailed on Jul. 9, 2010.
(Continued)

*Primary Examiner* — Bryce Bonzo
(74) *Attorney, Agent, or Firm* — Keating & Bennett, LLP

(57) ABSTRACT

A convolution interleaver for processing a codeword derived from an input block of symbols using a redundancy-adding coding, and having more symbols than the input block, wherein the codeword has a sequence of interleaving units, wherein each interleaving unit has at least two symbols, includes an interleaver. The interleaver changes the sequence of interleaving units to obtain an interleaved codeword having a changed sequence of interleaving units. In particular, the order of the symbols within an interleaving unit is not changed by the interleaver. The order of the interleaving units in the codeword among each other or with respect to a previous or subsequent codeword is changed, however.

34 Claims, 7 Drawing Sheets

U.S. PATENT DOCUMENTS

| | | | |
|---|---|---|---|
| 5,742,612 | A | 4/1998 | Gourgue et al. |
| 5,875,199 | A | 2/1999 | Luthi |
| 5,978,883 | A | 11/1999 | Hanna |
| 6,029,264 | A | 2/2000 | Kobayashi et al. |
| 6,118,825 | A | 9/2000 | Ikeda et al. |
| 6,598,202 | B1 | 7/2003 | Kim et al. |
| 7,549,107 | B1 * | 6/2009 | Lauer ............................ 714/756 |
| 7,653,143 | B2 * | 1/2010 | Kim et al. ..................... 375/270 |
| 7,840,866 | B2 * | 11/2010 | Park et al. ..................... 714/752 |
| 2003/0188248 | A1 * | 10/2003 | Kauschke et al. ............ 714/755 |
| 2004/0044945 | A1 | 3/2004 | Park et al. |
| 2007/0208987 | A1 * | 9/2007 | Kim et al. ..................... 714/756 |

FOREIGN PATENT DOCUMENTS

| | | |
|---|---|---|
| JP | 05-219015 A | 8/1993 |
| JP | 10-098397 A | 4/1998 |
| JP | 2004-007544 A | 1/2004 |
| RU | 2 110 148 C1 | 4/1998 |
| RU | 2 265 960 C2 | 12/2005 |
| RU | 2 273 093 C2 | 3/2006 |
| WO | 99/08412 A1 | 2/1999 |
| WO | 00/16336 A1 | 3/2000 |
| WO | 2006/004302 A1 | 1/2006 |

OTHER PUBLICATIONS

English Language Abstract of RU 2 212 103 C2.
English translation of an Official Communication issued in corresponding Korean Patent Application No. 10-2008-7030012, mailed on Jul. 29, 2011.
"3rd Generation Partnership Project; Techincal Specification Group Radio Access Network; Multiplexing and Channel Coding (FDD)," Mar. 2002, 74 pages.
Official Communication issued in corresponding Japanese Patent Application No. 2009-513592, mailed on Sep. 20, 2011.
Official Communication issued in International Patent Application No. PCT/EP2007/004998, mailed on Feb. 27, 2008.
Heegard et al., "Chapter 3: Interleaving," Turbo Coding, Kluwer International Series in Engineering and Computer Science, Kluwer Academic Pub., Boston, MA., 1999, pp. 35-63.
Sharma et al., "Soft Decision Multi-User Iterative Decoding Using a Block Turbo Code for SFH/SSMA," The 11th IEEE International Symposium, Sep. 18-21, 2000, Piscataway, NJ., pp. 736-740.
Belloni, "Fading Models," S-72.333 Postgraduate Course in Radio Communications, Autumn 2004, pp. 1-4.
Official Communication issued in corresponding Canadian Patent Application No. 2,654,171, mailed on May 16, 2012.

* cited by examiner

INTERLEAVER APPARATUS AND RECEIVER FOR A SIGNAL GENERATED BY THE INTERLEAVER APPARATUS

BACKGROUND OF THE INVENTION

The present invention relates to digital transmission technology and particularly to transmission concepts particularly well suited for time-varying transmission channels as can be found in mobile radio and broadcasting.

Time interleaving and/or frequency interleaving combined with error-correcting codes (forward error correction, FEC) belong to a basic principle in transmission technology, as shown in FIG. 6.

An information word consisting of information bits here is input in an FEC encoder establishing a codeword from this information word, i.e. a vector of code symbols or code bits. These codewords and/or blocks formed therefrom are passed to the interleaver. It changes the order of the symbols and passes the symbols thus mixed onto the transmission channel. The re-sorting of the symbols may take place in the time axis ("time interleaving") and/or in the frequency axis ("frequency interleaving").

The use of an interleaver makes sense if the transmission channel is not static, i.e. if its properties change with time and/or frequency. Thus, the signal power arriving in the receiver may vary strongly in a receiver being moved. Thereby, some code symbols are faulty with higher probability (e.g. by superposed thermal noise) than others.

Depending on the movement of transmitter, receiver and/or objects along the transmission path and depending on the nature of the surroundings of transmitter, receiver and transmission path, the channel properties may change more or less quickly. A measure of the temporal constancy of the transmission channel is the coherence time: the channel does not change significantly in this time.

The probability of a transmission error usually is estimated from the channel state. The channel state describes the quality of the reception signal (e.g. the momentary ratio of signal strength to noise). It is the aim of an interleaver to distribute the information in time (and often also in frequency) so that, with time-varying channel properties, the ratio of "good" (small probability of a transmission error) to "bad" (high probability of a transmission error) symbols becomes approximately temporally constant on average behind the de-interleaver, which reverses the interleaver on the transmission side. In the case of a quickly changing channel property (e.g. high vehicle speeds), usually a relatively short interleaver is sufficient. With slowly time-varying channel properties, a correspondingly greater interleaver length should be chosen.

The change in the channel properties may result from various effects.

In the case of multi-path propagation, the relative phase location of the signal proportions determines whether the signal proportions superimpose constructively or destructively. Even a change in position by a fraction of the wavelength of the carrier signal here leads to other phase locations. The channel properties may change correspondingly quickly. This is referred to as "fast fading".

The signal properties do, however, also strongly depend on the surroundings. Thus, e.g. walls attenuate the signal. Correspondingly, the signal quality within a house usually is worse than outside. The change in the signal properties correlated with the surroundings changes slowly as compared with the fast fading. Correspondingly, this is referred to as "slow fading".

Usually, only the properties of the fast fading are considered in the interleaver design. Since memory costs become less and less, however, increasingly very long interleavers now also become interesting. In this case, the properties of the slow fading have to be considered to an increasing extent in the interleaver design.

The following may be mentioned as examples for slow fading:

Mobile reception of satellite signals. For a moving car, the reception scenario constantly changes corresponding to the surroundings. For each reception scenario, three reception states may be defined.

There is a line-of-sight link to the satellite (e.g. open road). This is referred to as "line-of-sight state" (LOS)

The signals are attenuated (e.g. by trees). This state often is referred to as "shadow state"

The signal is attenuated so heavily that it is no longer useful. This is often referred to as "blockage state".

Transmission in cellular networks with transmitters of relatively low transmission power.

In cellular networks area coverage is achieved by many transmitters. For this kind of networks, it has to be reckoned with the fact that the reception conditions change relatively quickly. Since the transmitter distance is small, the relative distance of the receiver may change quickly. In this case, the signal properties in long interleavers may change strongly already within the interleaver length.

In the receiver, the exchange of code symbols (=interleaving) performed in the transmitter is reversed again (=de-interleaving). This leads to the fact that burst errors occurring in the transmission are distributed as individual errors to the entire data block behind the de-interleaver and my thus be corrected more easily by the FEC decoder.

The following interleaver types are to be distinguished:
convolution interleaver
block interleaver Convolution interleavers deal with "inter-block interleaving", i.e., blocks are "blurred" temporally such that blocks being in succession before the interleaver are intertwined behind the interleaver. Here, a block is formed of one or more codewords. The interleaver length does not depend on the block size, but on the width of the blurring.

In an exemplary convolution interleaver, a block of FEC code symbols is divided into e.g. four partial blocks of unequal size by the interleaver and intertwined with the upstream and/or downstream blocks.

Convolution interleavers are characterized in that the output of the FEC encoder is divided into various partial data streams via a de-plexer. The principle is illustrated in FIG. 7. Here, the data stream usually is distributed to the partial data streams in bit-wise manner or in groups of bits ("symbols"). Each partial data stream then is delayed via delay lines (e.g. implemented via FIFOs).

For synchronization of the convolution de-interleaver in the receiver, only the de-multiplexer needs to be synchronized.

The length of the delay lines may be regularly stepped. Any arrangements may be chosen, however, so that successive symbols lie as far apart as possible and the channel properties therefore are uncorrelated.

Block interleavers deal with "intra-block interleaving", i.e. the processing takes place in block-wise manner, with one block consisting of one or more codewords. The block size here defines the interleaver length. Here, systematic FEC codes frequently are employed; the data block here contains useful information (=the information to be transmitted) and additional redundancy, in order to be able to correct transmission errors.

Various types of block interleavers are known.

It is the basic principle of a block interleaver that the elements of a data vector or matrix are permuted, i.e. exchanged.

The variant of the block being taken for a matrix is best known. One row here forms e.g. one codeword (e.g. a Reed-Solomon codeword). The information then is copied into the matrix row by row and read out column by column in the transmitter/interleaver. As an example, the method from the ETSI Standard EN301192, which is illustrated in FIG. 8, is to be mentioned here.

FIG. 9 shows the arrangement of the useful data ("application data"). Reading out and/or transmitting then takes place in datagrams, with FIG. 9 further showing a matrix arrangement in rows, wherein the matrix has a number of rows equal to "no of rows". Furthermore, as an example, there is a number of columns extending from a number 0 to a number 190. In order to fill the matrix, so-called padding bytes continuing (cont.) up to the last padding bytes are added after the last datagram.

The interleaver properties may, among other things, be characterized by the following parameters:
End-to-End Delay:

This parameter defines the time interval between the time instant when the symbol is available at the input of the interleaver until the time instant when this symbol is available at the output of the de-interleaver.
(Receiver) Access Time Time interval between the time instant when the first symbol is available at the input of the de-interleaver and the time instant when the codeword is available and decodable at the input of the FEC decoder, which means at the output of the de-interleaver. According to the invention, one only needs to wait until a sufficiently large part of the codeword is available at the output of the de-interleaver, and not the complete time of the end-to-end delay, as long as the received packets have a sufficient signal-to-noise ratio. This parameter determines the time between switching on the receiver or switching to another program and the availability of the signal (e.g. audio or video signal) for the user e.g. in a broadcast receiver. Decoding of e.g. a video signal under some circumstances may mean further delay, which should not go into the access time, however. In this respect, it is to be noted that an audio or video decoder could generate further delay also having an effect on services not being time-interleaved.
Memory Requirement The memory requirement is determined by the interleaver length and the interleaver type as well as the chosen representation of signals in the transmitter or receiver.

The above-described interleaver concepts are characterized by good scrambling both within a codeword or block and beyond codeword boundaries in temporal respect. As illustrated in FIG. 7, a change in the order of the individual symbols in a codeword serially entering the input-side de-multiplexer is achieved by the delay elements in the outer interleaver. With respect to the transmission of these data, this does not have to be temporal scrambling here, however, but frequency scrambling may also be achieved therewith. Frequency scrambling is achieved, for example, if the data stream output from the multiplexer at the right-side end of the outer interleaver is serial-parallel converted and associated with a set of e.g. 1024 carriers in an OFDM symbol, so that two bits of the output-side data stream are associated with a carrier if QPSK mapping is used, for example, so that an OFDM occupation accommodates 2048 bits in the order as generated by the outer interleaver. Naturally, this means that bits and/or FEC symbols are arranged on other carriers as they would have been arranged if the outer interleaver had not been present, due to the delay elements in the outer interleaver.

A convolution interleaver or interleaving interleaver with delays thus works either as time interleaver or as frequency interleaver or both as time and frequency interleaver, depending on the subsequent implementation.

It is disadvantageous in the interleaver structure shown in FIG. 7 that there are high expenditure and high memory requirements both on transmitter side and on receiver side. This disadvantage becomes increasingly grave, the bigger the codewords become, i.e. the more bits are input as a block into an FEC encoder, and the more bits are output as a block from the FEC encoder, as shown in FIG. 6, for example. FEC encoders have code rates smaller than 1. A code rate of ⅓, for example, means that the number of bits in a codeword output from the FEC encoder is three times the number of bits in an input block or information word input into the FEC encoder, as outlined in FIG. 6. The interleaver now is to perform as good a temporal and frequency scrambling as possible, so that a multiplexer control, and/or generally speaking "processing" of its own, is needed for every bit and/or for every byte (depending on the coding scheme of the FEC).

This directly entails that a corresponding de-interleaver control is needed on the receiver side as well. Furthermore, quality information, such as a value for an achieved signal/noise ratio, for a bit error probability or a probability for the value of the bit and/or byte, has to be generated for decoding for each bit and/or for each symbol, wherein such probabilities are employed especially in so-called soft decoders. While this is not that critical in relatively small codewords yet, the problem increases, the longer the codewords become. For reduced transmitter complexity and particularly for reduced receiver complexity, which is particularly critical for broadcasting applications, since the receivers are mass products and have to be offered cheaply, this means that actually a small codeword length is desirable. On the other hand, a greater codeword length provides better advantages with slowly time-varying channel properties, since a codeword can be "distributed" over a longer period of time and/or a greater frequency range.

SUMMARY

According to an embodiment, an interleaver apparatus for processing a codeword derived from an input block of symbols using redundancy-adding coding, and having more symbols than the input block, wherein the codeword has a sequence of interleaving units, wherein each interleaving unit has at least two symbols, may have: a block interleaver for changing an order of symbols in the codeword so that an order of symbols as generated by the redundancy-adding coding is changed so as to acquire the codeword having the sequence of interleaving units; and an interleaver for changing the sequence of interleaving units to acquire an interleaved codeword having a changed sequence of interleaving units, wherein the interleaver is formed not to change an order of the symbols within an interleaving unit and to change the sequence so that at least one interleaving unit of a previous or subsequent codeword is arranged between two interleaving units of the codeword.

According to another embodiment, a transmitter for generating a transmission signal may have: a redundancy-adding encoder with a code rate smaller than 1, which is formed to generate, from an input block of signals, a codeword having a number of symbols greater than a number of symbols of the input block; an interleaver for changing the sequence of interleaving units to acquire an interleaved codeword having a changed sequence of interleaving units, wherein the interleaver is formed not to change an order of the symbols within an interleaving unit and to change the sequence so that at least one interleaving unit of a previous or subsequent codeword is arranged between two interleaving units of the codeword; and a modulator for modulating a data stream output from the interleaver onto a transmission channel.

According to another embodiment, a method of processing a codeword derived from an input block of signals using redundancy-adding coding, and having more symbols than the input block, wherein the codeword has a sequence of interleaving units, wherein each interleaving unit has at least two symbols, may have the steps of: changing an order of symbols in the codeword so that an order of symbols as generated by the redundancy-adding coding is changed so as to acquire the codeword having the sequence of interleaving units; and changing the sequence of interleaving units to acquire an interleaved codeword having a changed sequence of interleaving units, wherein changing is performed so that an order of the symbols within an interleaving unit is not changed and the sequence is changed so that at least one interleaving unit of a preceding or subsequent codeword is arranged between two interleaving units of the codeword.

According to another embodiment, a receiver for receiving a signal derived from a block of symbols using redundancy-adding coding, and based on a codeword having a sequence of interleaving units, wherein the sequence of interleaving units has been changed, wherein an order of symbols in the codeword as generated by the redundancy-adding coding has been changed, further wherein an order of the symbols within an interleaving unit has not been changed, and wherein at least one interleaving unit of a previous or subsequent codeword is arranged between two interleaving units of the codeword, may have: a detector for detecting interleaving units from the signal; a side information estimator for estimating side information for an interleaving unit related to a transmission of the entire interleaving unit; and a processor for processing the interleaving unit further based on the side information determined for the respective entire interleaving unit.

According to another embodiment, a method of receiving a signal derived from a block of symbols using a redundancy-adding coding, and based on a codeword having a sequence of interleaving units, wherein the sequence of interleaving units has been changed, wherein an order of symbols in the codeword as generated by the redundancy-adding coding has been changed, further wherein an order of the symbols within an interleaving unit has not been changed, and wherein at least one interleaving unit of a previous or subsequent codeword is arranged between two interleaving units of the codeword, may have the steps of: detecting interleaving units from the signal; estimating side information for an interleaving unit related to a transmission of the entire interleaving unit; and further processing the interleaving unit on the basis of the side information determined for the respective entire interleaving unit.

According to another embodiment, a computer program may have a program code for performing, when the method is executed on a computer, a method of processing a codeword derived from an input block of signals using redundancy-adding coding, and having more symbols than the input block, wherein the codeword has a sequence of interleaving units, wherein each interleaving unit has at least two symbols, wherein the method may have the steps of: changing an order of symbols in the codeword so that an order of symbols as generated by the redundancy-adding coding is changed so as to acquire the codeword having the sequence of interleaving units; and changing the sequence of interleaving units to acquire an interleaved codeword having a changed sequence of interleaving units, wherein changing is performed so that an order of the symbols within an interleaving unit is not changed and the sequence is changed so that at least one interleaving unit of a preceding or subsequent codeword is arranged between two interleaving units of the codeword.

According to another embodiment, a computer program may have a program code for performing, when the method is executed on a computer, a method of receiving a signal derived from a block of symbols using a redundancy-adding coding, and based on a codeword having a sequence of interleaving units, wherein the sequence of interleaving units has been changed, wherein an order of symbols in the codeword as generated by the redundancy-adding coding has been changed, further wherein an order of the symbols within an interleaving unit has not been changed, and wherein at least one interleaving unit of a previous or subsequent codeword is arranged between two interleaving units of the codeword, wherein the method may have the steps of: detecting interleaving units from the signal; estimating side information for an interleaving unit related to a transmission of the entire interleaving unit; and further processing the interleaving unit on the basis of the side information determined for the respective entire interleaving unit.

The present invention is based on the finding that good efficiency can be maintained also in the case of increasing codewords, if the interleaver apparatus providing the task of the convolution interleaver does not perform interleaving in FEC-symbol-wise manner, but works with interleaving units (IU), wherein one interleaving unit comprises at least two FEC symbols. In certain FEC encoders, an FEC symbol is one bit. In this case, an interleaving unit comprises at least two bits. In other FEC encoders, an FEC symbol is one byte. Then, an interleaving unit includes at least two bytes. The codeword, which comprises a sequence of interleaving units, with each interleaving unit having associated at least two symbols, thus is fed into the interleaving means so as to obtain an interleaved codeword having a changed sequence of interleaving units. In particular, the interleaving is performed so that an order of the symbols within an interleaving unit is not changed, while the sequence of the interleaving units is changed so that at least one interleaving unit of a proceeding or subsequent codeword is arranged between two interleaving units of one and the same codeword, or that an order of interleaving units in the interleaved codeword is different from an order of the sequence of interleaving units of the codeword prior to the processing by the interleaving means.

The interleaving achieved thereby is scalable, since the number of the symbols in an interleaving unit can be adjusted arbitrarily. In order words, in a fixedly existing or fixedly designed interleaver, which works in interleaving units and no longer in symbols, the codeword length may be increased or decreased arbitrarily. To this end, the interleaver structures do not have to be changed. Only the number of symbols in an interleaving unit has to be changed. With a fixed number of interleaver taps, a greater codeword can be processed if the number of symbols in an interleaving unit is increased, while the number of symbols in an interleaving unit may be reduced when smaller codewords are to processed. The greater the number of symbols in an interleaving unit, the more efficient the receiver- and also transmitter-side processing becomes. On the other hand, with an increasing number of symbols in an interleaving unit, the favorable effect of the convolution interleaving may subside. This effect may, however, be weakened if, upstream to the convolution interleaver, there is connected a block interleaver not working in interleaving-unit-wise manner, but actually performing block interleaving in FEC-symbol-wise manner before forming the interleaving units. In this embodiment of the present invention, a block interleaver and a convolution interleaver thus are combined, wherein the block interleaver works in a symbol-wise manner across the entire block, however, while the convolution interleaver only works in interleaving-unit-wise and not symbol-wise manner.

In other embodiments, the effective block interleaver may even be replaced by special FEC codes, which already achieve a particularly good distribution of the information across the entire codeword, as are e.g. FEC encoders with a very long shift register length (e.g. more than 25 memory cells) of the linear-feedback shift register (LFSR).

According to the invention, the entire receiver may now be changed to interleaving-unit-wise processing. Hence, soft information, i.e. side information, associated with a received interleaving unit, no longer has to be determined in symbol-wise, but only in interleaving-unit-wise manner. If an interleaving unit has eight symbols, for example, this means an 8-fold reduction of the receiver cost.

Moreover, the memory management can be simplified significantly not only on the transmitter side, but also on the receiver side, since memories can be read in and read out substantially more quickly in bursts, wherein a burst is especially efficient when it concerns adjacent memory addresses. Since the order within an interleaving unit is not changed, an interleaving unit may therefore be read out especially efficiently by a receiver memory in burst-like manner to perform the functionality of the interleaving. The individual interleaving units are indeed arranged at different memory addresses, which may well be distributed far apart within the memory. The symbols within an interleaving unit, however, are contiguous and thus also are filed contiguously in the receiver memory, since the transmitter-side convolution interleaver does not touch the order of the symbols within an interleaving unit.

Further advantages of the present invention are that the management cost and the memory cost for the side information are reduced strongly on the receiver side, since the side information only has to be generated, managed and employed for an interleaving unit and no longer for every individual symbol. Moreover, in interleaving units, it may also be determined whether the decoder, in the case of relatively good transmission quality, has enough data to perform low-in-error or error-free decoding already after a certain time and/or after a certain number of received interleaving units. Then, further interleaving units may easily be ignored and marked as so-called "erasures" in the receiver. This leads to significant reduction in the end-to-end delay.

Furthermore, efficient energy management may be performed therewith, since the receiver or the relevant part of the receiver may be placed into a sleep mode, since enough interleaving units for correctly decoding have already been received.

Moreover, better receiver access time may also be achieved, since the receiver already is ready when it has enough interleaving units, and begins with decoding, and it does not take decoding a complete codeword for it to be ready.

Advantageously, input blocks, i.e. information words with a length of more than 5000 symbols, and may be with more than 10000 symbols, are employed. At a coding rate of ⅓, for example, the FEC encoder then provides codewords of more than 15000 symbols. In general, a codeword size at the output of the FEC encoder of more than 10000 bits is employed.

Interleaving units then not only have at least two bits/symbols, but at least 100 symbols, so that a number of interleaving units per codeword is smaller than 200 and optimally ranges from 10 to 50.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
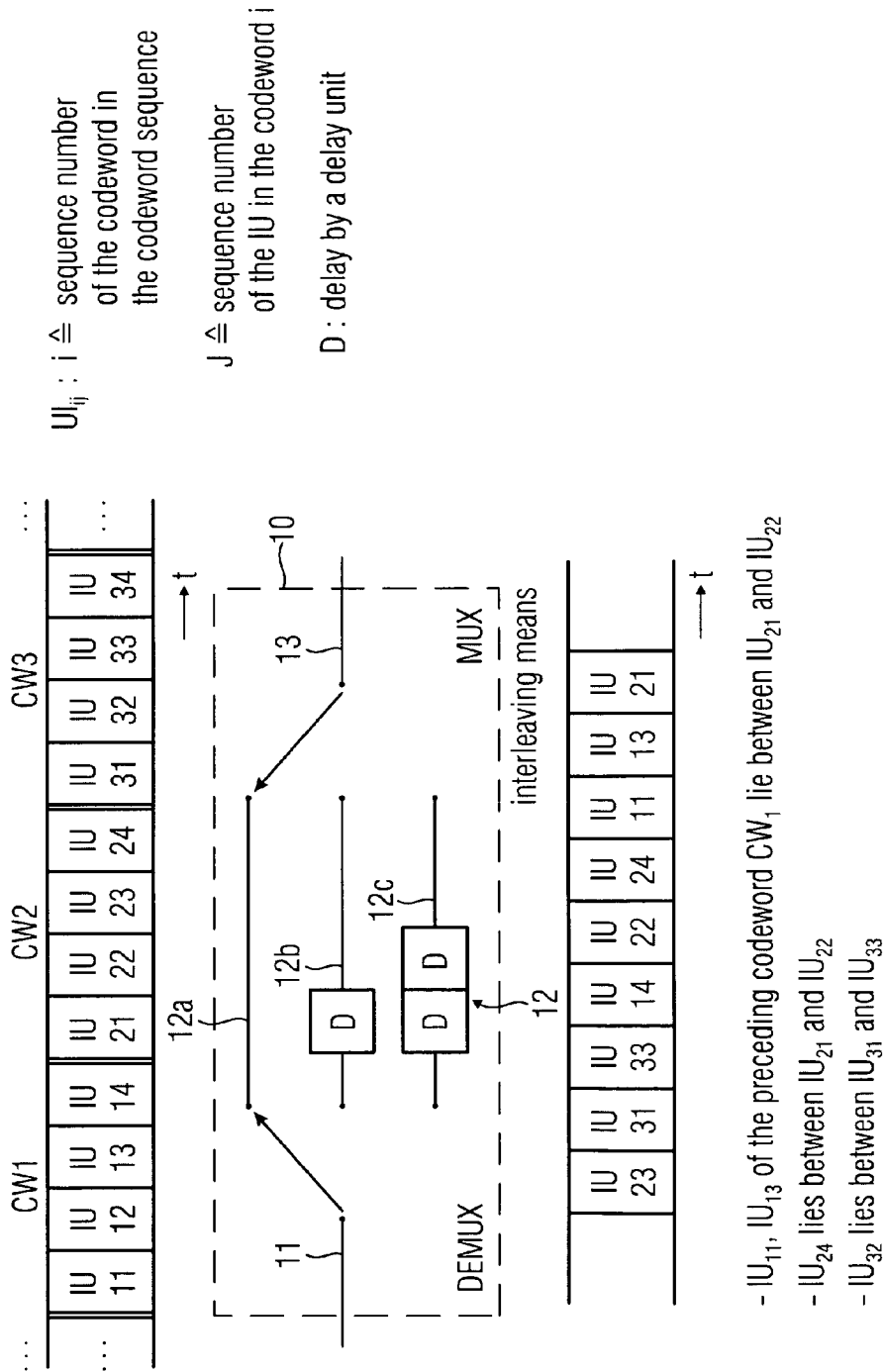
FIG. 1 is a principle illustration of the interleaver concept according to the invention.

Before explaining the individual figures in detail, at first special advantages of the interleaver apparatus, as will be described on the basis of FIG. 1, will be illustrated. Particularly in the case of long convolution interleavers, the present invention allows for efficient realization, which obtains its particular advantages not only in itself, but also in combination with special decoder strategies.

The goal of the invention is an interleaver structure allowing for efficient realization particularly in very long time interleavers. The structure is advantageous in connection with the decoder strategies.

The decoder strategies may be subdivided into the following groups

Without Channel State Information

Errors have to be recognized and corrected without additional information

Soft Decoding

The probability of a transmission error may be estimated for each bit or symbol.

Erasure Decoding

It is known that no symbol has been received. This form may be seen as a special case of soft decoding. For a bit or byte not having been received (or a bit or byte with extremely low signal/noise ratio), in a way "guessing" takes place, i.e. the probability of the bit being a "0" or a "1" is set to 50% each.

The chosen structure particularly offers advantages for soft decoding and erasure decoding. The chosen structure has the following advantages:

The channel state information needed for the erasure or soft decoding is formed for a block (interleaver unit=IU) each and stored together with the IU.

The channel state information may also be used in order to reduce the memory requirement. Thus, it is possible that e.g. only the data having sufficient signal quality are stored.

Since IUs of several bits (typically at least 100 or more) are managed as one block in the receiver, it is possible to employ e.g. modern memory chips, which usually support an access to a data block more efficiently than a selective access to individual memory cells.

The structure also allows for better management of the memory in the case of a program change or upon switching the receiver on. So as to avoid data from the old (=previously selected) program and the new program to be mixed, the memory has to be deleted in the case of a program change (or it is waited until the memory is filled with new data). With the proposed structure, it is sufficient if only the channel state information is set to "erasure".

The present invention describes an interleaver structure and accompanying decoder strategies, which are particularly relevant for systems with long time interleavers.

In connection with low-rate error-correcting codes, the interleaver allows for secure transmission also in the case of strongly time-varying channels, as typical e.g. in satellite transmissions or also cellular terrestrial networks. With suitable parameters and decoder strategies, many of the typical disadvantages of interleavers also are reduced, e.g. the higher access time and the greater memory requirement.

This is achieved by the data further being processed as small data packets (IU), on the one hand. This (as already mentioned above) allows for more efficient management of the data. So as to achieve full interleaver gain, however, it is advantageous for the data to be interleaved in bit-wise manner. This is achieved via a so-called mixer.

Through the concatenation of the two interleavers, the advantages of bit-wise interleaving thus are combined with the more efficient implementation of data-packet-orientated processing.

Figure 6:
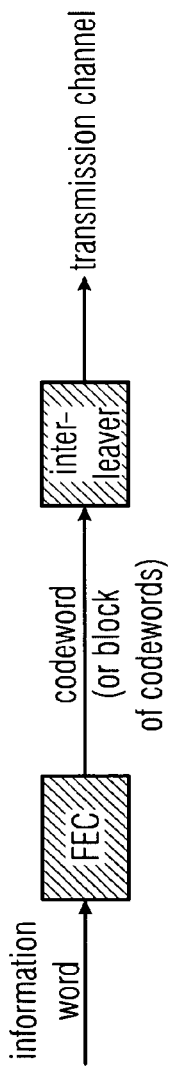
FIG. 6 is a principle illustration of a combination of an FEC encoder and an interleaver.
Figure 7:
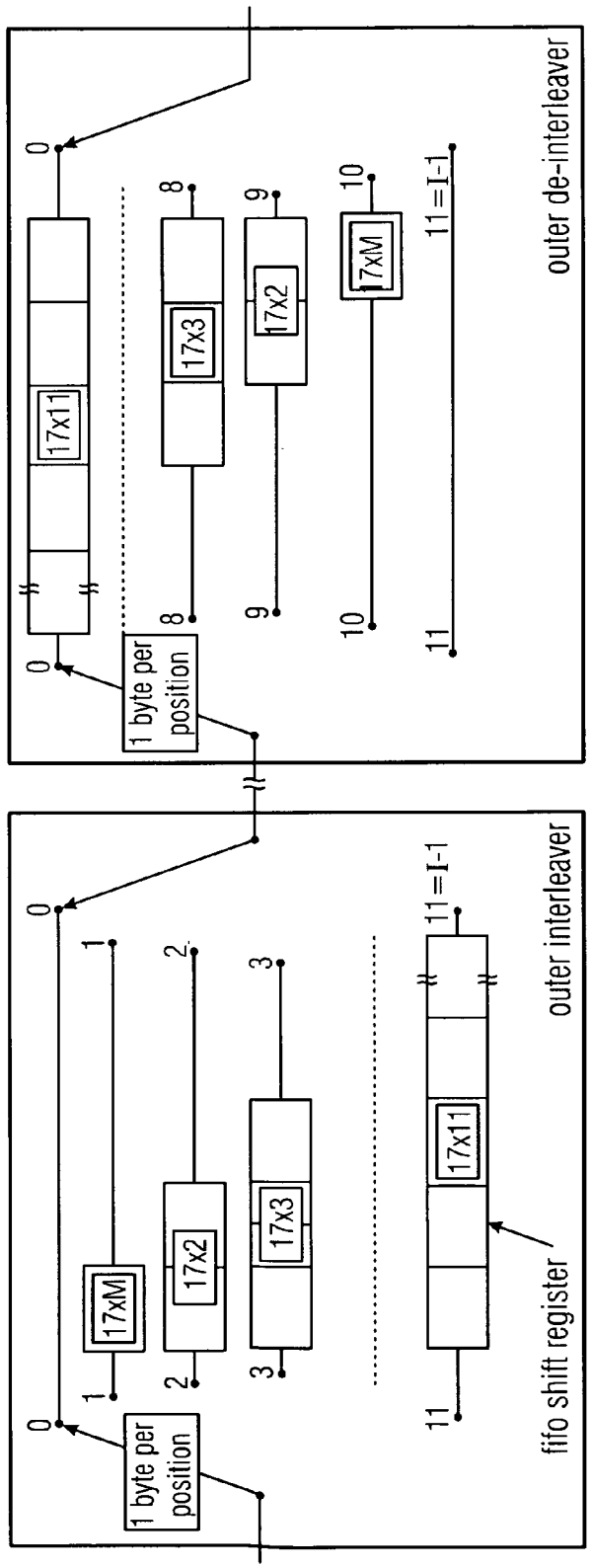
FIG. 7 shows a convolution interleaver from DVB-T EN 300744.
Figure 8:
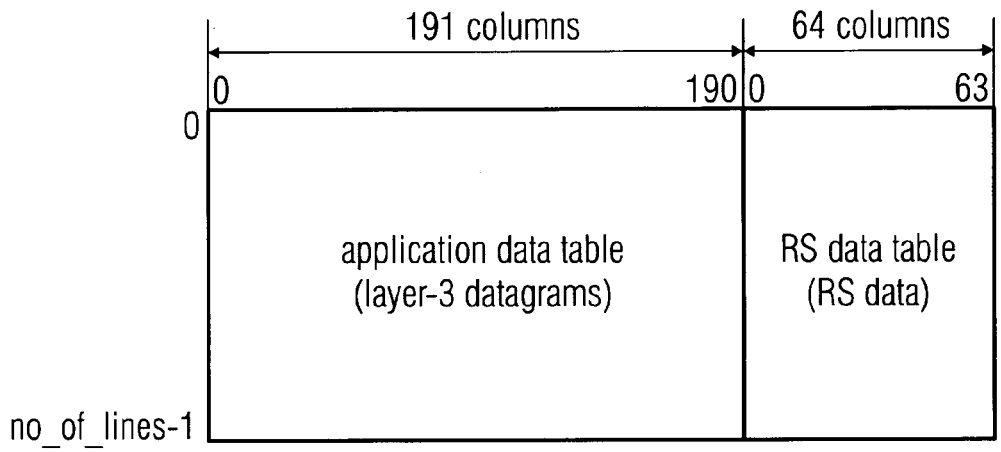
FIG. 8 shows a block interleaver structure according to EN 301192.
Figure 9:
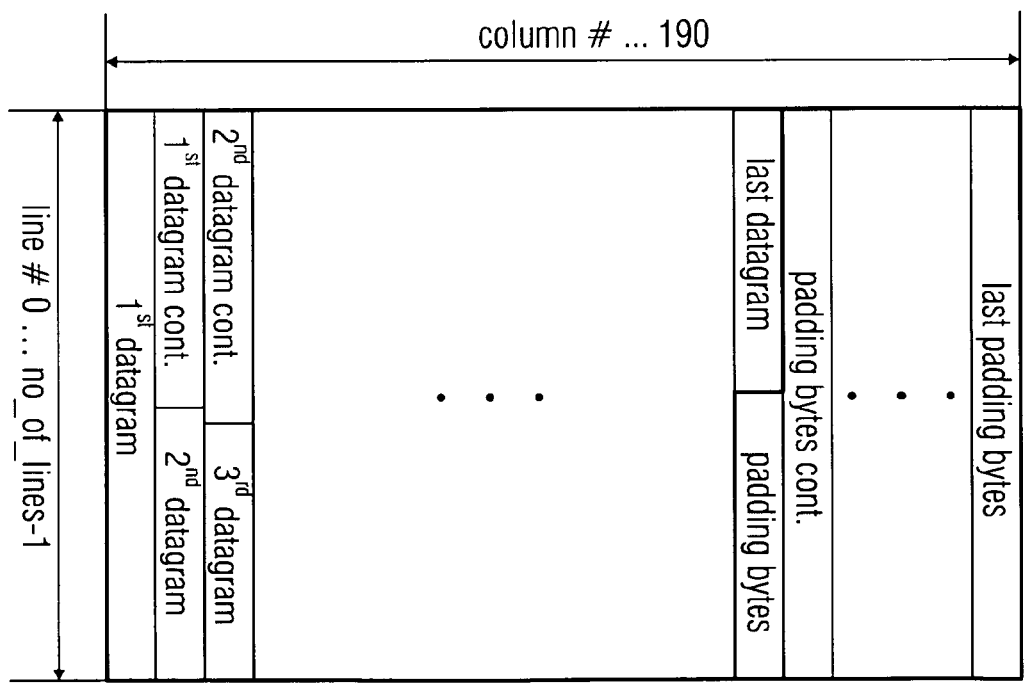
FIG. 9 shows an arrangement of the useful data "application data", wherein reading out and/or transferring takes place in datagrams.

FIG. 1 shows an interleaver apparatus according to the invention for processing several codewords CW1, CW2, CW3, which are arranged sequentially in time and form a stream of output data from an FEC encoder, as it is shown in FIG. 6, for example. Alternatively, the codewords may also already be codewords output from a block interleaver or "mixer", as will be explained with reference to FIG. 2. Each codeword is divided into a number of interleaving units IU, with each interleaving unit having two indices, namely the index i and the index j, for notation purposes only. The index i indicates the sequence number of the codeword in the codeword sequence, while the index j indicates the sequence number of the interleaving unit in the codeword i itself. Importantly, each interleaving unit includes several symbols, i.e. several bits or bytes, depending on the FEC encoder, wherein the number of bits or bytes, i.e., generally speaking, the number of symbols in an interleaving unit, advantageously is greater than 50 and smaller than 400.

Furthermore, the number of symbols in an interleaving unit is dependent on the codeword length, so that it is advantageous for each codeword to have at least 50 or even more interleaving units. For clarity reasons only, codewords are shown with only four interleaving units in the embodiment shown in FIG. 1.

A codeword is derived from an input block of symbols in an FEC encoder using redundancy-adding coding, wherein the codeword comprises more symbols than the input block, which is synonymous with the statement that the code rate of the redundancy-adding encoder is smaller than 1. The codeword comprises a sequence of interleaving units, with each interleaving unit comprising at least two symbols.

The interleaver apparatus includes, as the heart thereof, interleaving means 10 formed to change the sequence of the interleaving units in a codeword to obtain an interleaved codeword comprising a changed sequence of interleaving units. In particular, the interleaving unit 10 is formed not to change an order of the symbols within an interleaving unit, and to change the sequence of the interleaving units so that at least one interleaving unit of a preceding or subsequent codeword is arranged between two interleaving units of the codeword, and/or that an order of interleaving units in the interleaved codeword is different from an order of the sequence of interleaving units. Advantageously, the interleaving means is formed so as to have an input de-multiplexer 11, a plurality of connection lines and an output multiplexer 13. After feeding a number of complete interleaving units to one connection line, the input multiplexer is formed to switch to another connection line, wherein the number of complete interleaving units is equal to or greater than 1.

Furthermore, in the embodiment shown in FIG. 1, the first connection line 12a has a delay value of substantially zero. Thus, no delay element of its own in form of a FIFO memory or a special delay line is disposed. On the other hand, the second connection line 12b has a defined delay D, wherein the next connection line 12c has another defined delay, which is formed by the two delay means D and differs from the delay in the block 12b. The delay in the connection line 12c only exemplarily is two times that in the delay line 12b. Arbitrary delay ratios may be adjusted, but with an integer raster being advantageous at least among a certain number of connection lines of the plurality of connection lines, as will be detailed in connection with FIG. 10, wherein the embodiment shown in FIG. 10 comprises a plurality of connection lines comprising at least two, and in the embodiment shown in FIG. 10 even three, groups of connection lines among themselves, which are characterized by special common delay values.

Figure 2:
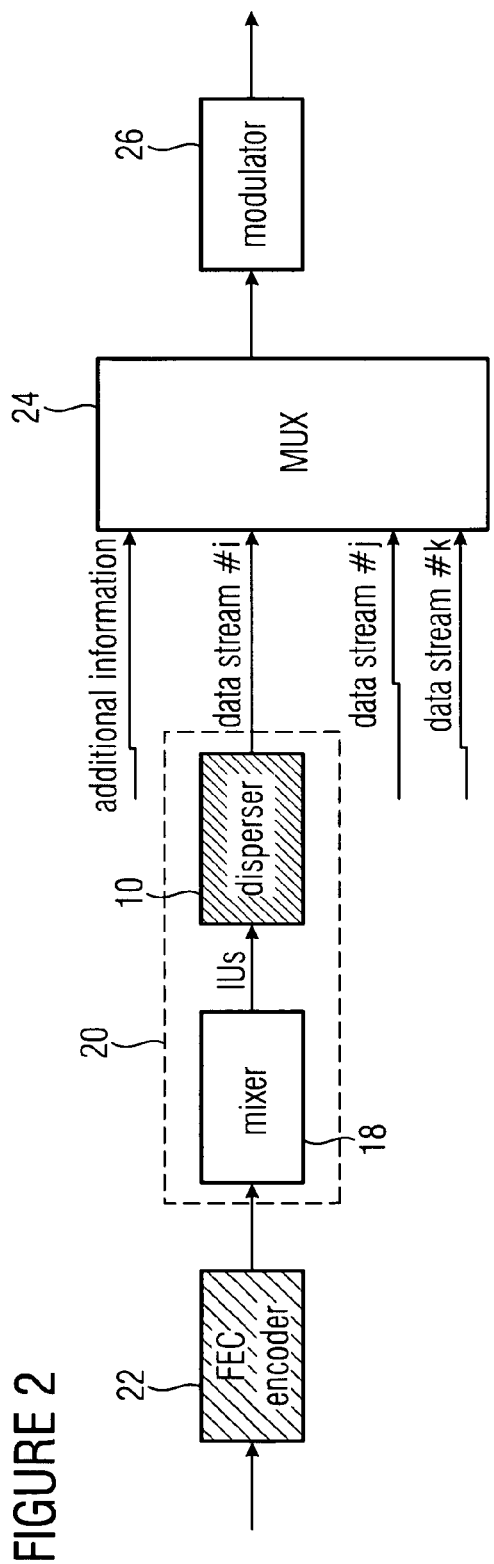
FIG. 2 shows an embodiment of a transmitter according to the invention.

FIG. 2 shows an embodiment for a transmitter, wherein the embedding of the interleaver apparatus of FIG. 1 into a transmitter concept also results from FIG. 2. The transmitter apparatus shown in FIG. 2 includes the interleaver apparatus according to the present invention, which is designated with 20 in FIG. 2, as well as an upstream FEC encoder 22, as well as a downstream multiplexer 24 and a modulator 26 downstream of the multiplexer. The interleaver apparatus 20 also includes the interleaving unit 10 shown in FIG. 1, in the embodiment shown in FIG. 2. This interleaving unit 10 is referred to as "disperser" in FIG. 2, but in principal has the same functionality as the interleaving unit 10 in FIG. 1. Upstream of the disperser 10, there is a mixer 18, which is also contained in an embodiment in the interleaver apparatus 20 according to the invention, in order to perform, prior to the interleaving-unit-wise processing in the disperser, a block interleaving function, in which symbol-wise interleaving, as changing the order of the symbols in a codeword output from the FEC encoder 22, is performed.

Figure 3:
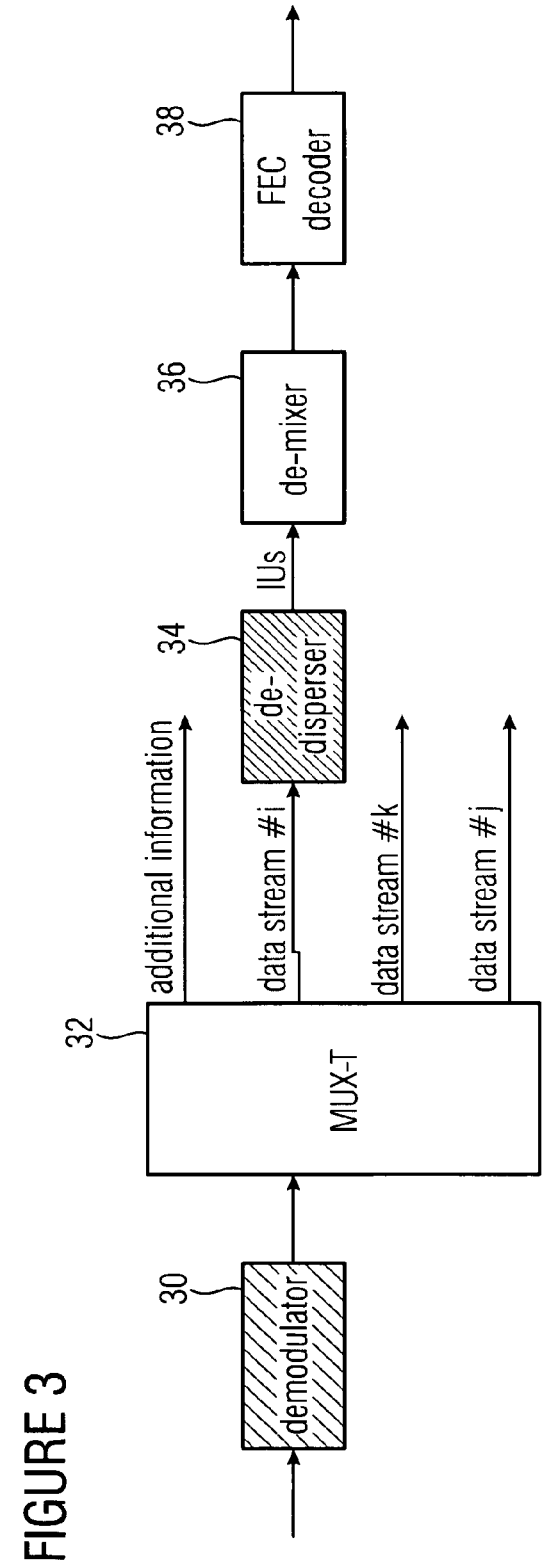
FIG. 3 shows an embodiment of a receiver according to the invention.

The receiver structure complementary thereto is shown in FIG. 3. The input signal is supplied to a demodulator 30 feeding a de-multiplexer 32 capable of extracting additional information and diverse data streams from the input signal. Only by way of example, the processing of the data stream is represented with the number i, wherein this data stream is the data stream having been generated in the example shown in FIG. 2. The processing on the transmitter side and on receiver side for other data streams k, j, which are other broadcast or television programs or other conversations, for example, may take place on transmitter and receiver side, just like the processing of the data stream i. The data stream i, which has been extracted by the multiplexer 32, is supplied to a de-disperser 34, which supplies interleaving units (IUs) to a de-mixer 36, which then restores the individual codewords, which may then be supplied to an FEC decoder 38, in order to again create, if the transmission has been sufficient and/or if enough redundancy has been added, a reproduction of the input block of symbols identical—apart from bit errors—with the input block of the symbols having been fed into the FEC encoder 22 of FIG. 2 on the transmitter side.

The FEC encoder 22 serves for redundancy addition to the input signal. To this end, e.g. powerful codes, such as turbo codes, as they are known e.g. from the 3GPP2 standard, or LDPC codes, as they are for example known from the DVB-S2 standard, are suitable. Other codes may also be employed, however. The output of the FEC encoder 22 is a codeword. The use of relatively long codewords, which are typically greater than 10000 bits, is advantageous for the transmission quality.

The mixer 20 is a kind of block interleaver exchanging the order of the bits within a codeword in symbol-wise, i.e. bit-wise or byte-wise, manner. Hereupon, the multiplexing in interleaving units takes place. The output of the mixer is subdivided into interleaving units (IUs). An interleaver unit is a group of bits or bytes, or generally a group of symbols. Typically a codeword should be subdivided into about 20 interleaver units or more. At a codeword size of more than 10000 bits, 200 or more bits per interleaving unit result.

The disperser 10 represents a kind of convolution interleaver serving to distribute the interleaver units in time. In contrast to normal convolution interleavers, the switching does not take place in bit- or symbol-wise manner, but in interleaving-unit-wise manner.

The output of the disperser 10 may then be multiplexed with other data, as it is shown in FIG. 2, i.e. additional information, other programs, or program groups.

The modulator 26 then generates an RF signal therefrom. Different modulators may be used. Here, only OFDM or a carrier modulation with n-PSK modulation are mentioned as examples.

The receiver shown in FIG. 3 includes the demodulator 30, which comprises an accompanying synchronization means. Furthermore, frame synchronization may be performed if the demodulator does not use any frame structure or utilizes another frame length. This frame synchronization serves for synchronization of the de-multiplexer and the de-interleaver.

The de-multiplexer 32 provides a data stream with a series of interleaving units at its output. Furthermore, a channel state estimation also is performed, as will be explained with reference to FIG. 4. Here, the channel state is estimated not in symbol-wise, but in interleaving-unit-wise manner or—generally speaking—one piece of reception quality information is provided per interleaving unit, somehow providing a statement regarding the reliability or reception quality of an interleaving unit as a whole. Channel states, signal-noise ratios, bit error rates etc. are such reception quality information. No reception quality information is determined or used per symbol.

The data stream is supplied to the de-disperser, which will still be explained, and which is implemented by means of memory management, for example. At the output of the de-disperser, multiplexing is performed to again generate, from the interleaving units at the output of the de-disperser, codewords then subjected to block de-interleaving in a de-mixer 36, in order to then finally perform decoding in the FEC decoder 38, for example Viterbi decoding or any other kind of decoding. Generally speaking, the de-disperser 34 performs an operation complementary to the functionality of the disperser 10, and the de-mixer 36 performs an operation complementary to the operation of the mixer 18. The receiver-side elements 34 and 36, however, do not have to process entire codewords, but may also replace certain interleaving units with erasures, as will still be explained subsequently, so that the de-interleaver operations of the elements 34 and 36 then are performed using erasure information, and not using actually received interleaving units.

Subsequently, the mixer 18 will be explained in greater detail.

The mixer is a block interleaver permuting the bits within a shorter block, e.g. a codeword.

In an interleaver scheme with a disperser, the de-mixer serves to distribute the burst errors inevitably occurring behind the de-disperser due to the IU-wise de-interleaving as favorably as possible over a block, e.g. uniformly over a codeword, so that the decoding process provides better results.

In one embodiment, the interleaving of input bits a[i] to output bits b[i] takes place corresponding to the following formula:

$$b[i]=a[(CILM\_Inc*i) \bmod codewordLen],$$

wherein
codewordLen is the cord word length,
CILM_Inc is a configurable parameter, and
mod is the modulo operation.

Subsequently, the disperser 10 of FIG. 2, as it is also generally illustrated in FIG. 1, will be explained.

The actual time interleaver (possibly also employed as frequency interleaver) is the disperser. It distributes the blocks (e.g. codewords) output by the mixer over time (and/or over the frequency). The disperser is a convolution interleaver not working in bit-wise, but block-wise manner. Due to the block-wise functioning, the use of a mixer makes sense (see above).

The advantages of the block-wise interleaving are to be seen, among other things, in the receiver:

De-interleaving usually takes place by storing the incoming data in an intermediate store and subsequently reading in the de-interleaved order. Storing and reading in block-wise manner allows for efficient control of the memory. A dynamic random access memory (RAM) may after all be written to and read far more quickly in bursts than when accessing individual bytes non-contiguously. Thereby, in the case of block-wise interleaving, (a) a slower/cheaper memory than in the case of bit-wise interleaving can be provided, or (b) the memory may be shared in better way with other users (arbitration of a shared memory), so that less memory packages are needed. In both cases, cost savings may be achieved.

Management of the reception data in the de-interleaver takes place more efficiently: channel state information (e.g. the estimation of the signal-noise ratio) only has to be stored per IU, instead of per each symbol/bit; memory space is saved thereby. Moreover, IU-wise storage enables the interleaver management to delete individual IUs when they are not needed, e.g. when enough "good" (hardly disturbed) IUs have been received from a codeword, "bad" IUs no longer have to be stored, and already received ones can be released easily by means of intelligent interleaver management. Intelligent interleaver management here means that an interleaver control unit keeps side information on each stored IU in a table, in order to optimize the decoder result and the memory needed. The interleaver control unit can determine which IUs are needed in the further decoding process, and which ones are not. For the decoding, the IUs not stored have to be replaced by erasures. The de-mixer therefore obtains a number of erasures for these IUs from the de-disperser.

Figure 10:
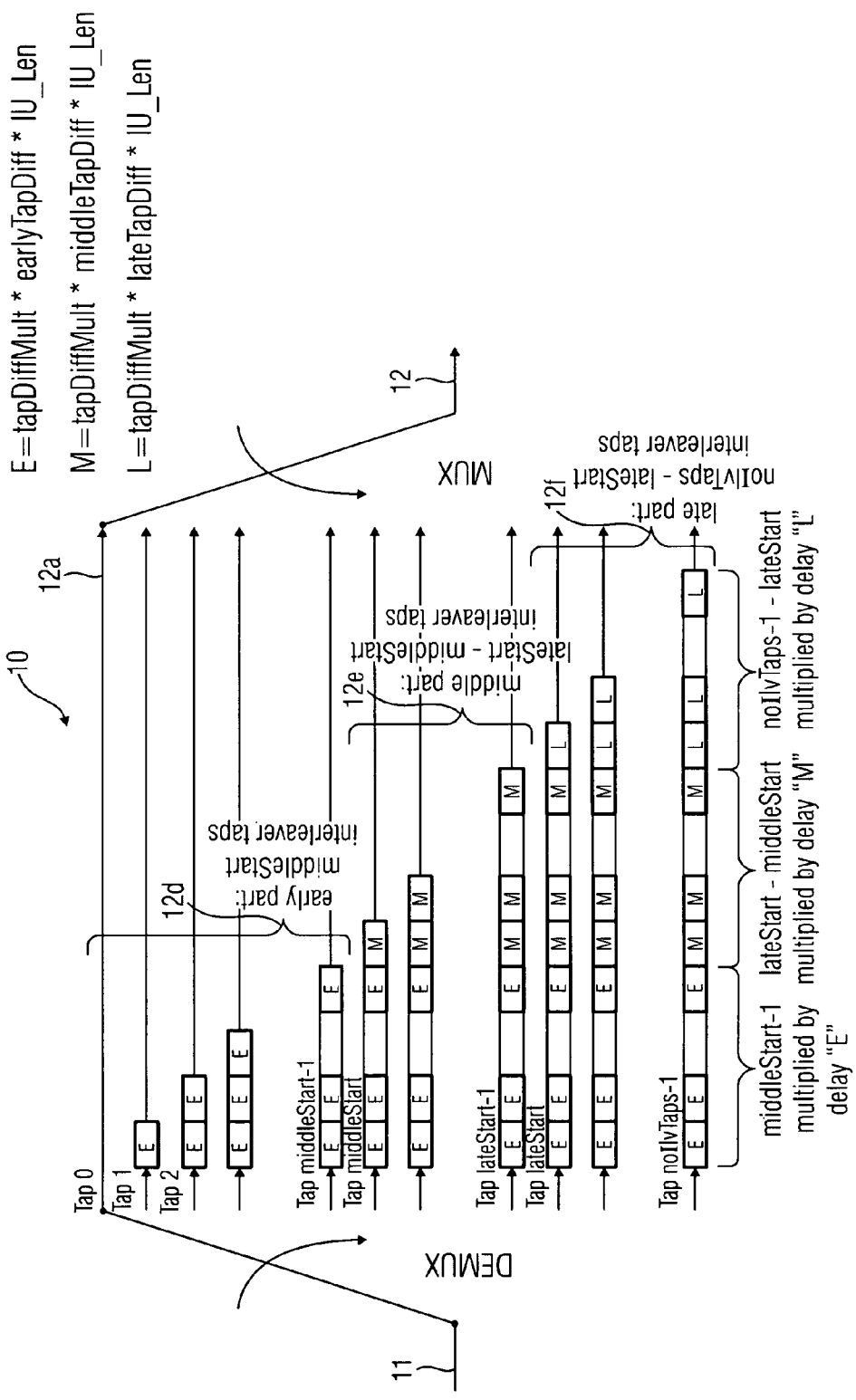
FIG. 10 shows an embodiment of the interleaver apparatus according to the invention with three groups of connection lines with different delays.

FIG. 10 shows the principle structure of the convolution interleaver in the disperser for one embodiment. The interleaver shown has irregular delay lines.

The disperser includes noIlvTaps parallel delay lines, wherein noIlvTaps corresponds to the block size at the mixer output divided by the size of one IU (IU_Len in the following). The lines are fed one after the other by a de-multiplexer (DEMUX). The input of this de-multiplexer is a stream of code bits or symbols from the output of the mixer. The DEMUX feeds each delay line with exactly one interleaver unit (IU), which corresponds to IU_Len code bits or symbols from the output of the mixer. Then, the DEMUX switches to the next line, and so forth. At the beginning of a block processed by the mixer (e.g. a codeword) the DEMUX switches to the next line (index 0). The end of a block is reached when the DEMUX has fed an IU into the last line (index noIlvTaps−1).

The interleaver shown may be configured via the seven parameters of noIlv-Taps, middleStart, lateStart, tapDiffMult, earlyTapDiff, middleTapDiff, lateTapDiff.

Each line includes delay elements. There are three possible elements, as can be seen in FIG. 10:

Delay "E" includes tapDiffMult*earlyTapDiff IUs (i.e. tapDiffMult*earlyTapDiff*IU_Len bits/symbols)

Delay "M" includes tapDiffMult*middleTapDiff IUs

Delay "L" includes tapDiffMult*lateTapDiff IUs

At the output of the lines, a multiplexer (MUX) collects the outputs of the delay elements. Its switching of the lines is perfectly synchronized with the DEMUX.

The output of the MUX thus is a stream of IUs of the interleaved blocks or codewords.

The IUs in the first line (index 0) are undelayed. All other IUs with index 0<i<noIlvTaps of the block/codeword are delayed as follows with respect to the first IU (see also FIG. 10):

for 0<=i<middleStart: the delay in blocks/codewords is i*tapDiffMult*earlyTapDiff for middleStart<=i<lateStart: the delay in blocks/codewords is (middleStart−1)*tapDiffMult*earlyTapDiff+(i−middleStart+1)*tapDiffMult*middleTapDiff for lateStart<=i<noIlvTaps: the delay in blocks/codewords is (middleStart−1)*tapDiffMult*earlyTapDiff+(lateStart−middleStart)*tapDiffMult*middleTapDiff+(i−lateStart+1)*tapDiffMult*lateTapDiff For this reason, the first middleStart IUs ("early part") of the block/codeword are distributed differently in time than the middle (lateStart−middleStart) IUs ("middle part") and the last (noIlvTaps−lateSTart) IUs again are distributed differently:

the distance between IUs of the early part, which belonged to the same block/codeword prior to the interleaving, then is tapDiffMult*earlyTapDiff, the distance between IUs of the middle part is tapDiffMult*middleTapDiff blocks/codewords the distance between IUs of the late part is tapDiffMult*lateTapDiff blocks/codewords, By configuring the 7 interleaver parameters, it is possible to select the appropriate interleaver profile, i.e. a favorable distribution of the content of a block/codeword over time (and/or frequency). For example, many IUs may be transmitted with short delay in the late part, if this is desirable, or the IUs may be distributed uniformly over a given time period, or both may be combined, etc.

FIG. 10 shows an embodiment of the previously described interleaver apparatus, which is also referred to as disperser. In particular, the interleaver apparatus or interleaving means of the interleaver apparatus shown in FIG. 10 includes the input multiplexer 11, which is formed as de-multiplexer and referred to as DEMUX in FIG. 10. Furthermore, there is the output multiplexer 12, which is referred to as MUX in FIG. 10. Between the two multiplexers 11 and 12, there are a plurality of connection lines, which are subdivided into three groups in the embodiment shown in FIG. 10, as already described. The first group is the early part 12d. The second part is the middle part 12e, and the third group is the late part 12f.

Each delay line and/or connection line with delay, except for the very first connection line 12a, has a certain delay unit, wherein the delay units may, however, be configured differently in the three groups, namely via the parameter earlyTapDiff for the group 12d, via the parameter middleTapDiff for the group 124 and the parameter lateTapDiff for the group 12f.

FIG. 10 further shows that the delay increases by an increment (E, M or L) from connection line (Tap) to connection line, so that e.g. the connection line Tap middleStart−1 has a number of Tap middleStart−1 delay elements E. Furthermore, each connection line of the second group 12e has the same number of delay units E as the last connection line of the first group, as well as additionally a number of M-delays increasing from connection line to connection line. Correspondingly, each connection line of the late group also has the same number of E delays as the last connection line of the first group and the same number of M delays as the last connection line of the second group, as well as a number of L-delay elements increasing from connection line to connection line.

The first group and the second group and the third group each include connection lines, wherein each of these connection lines, except for the very first connection line of the first group, has a defined amount of delay or an integer multiple of the defined amount of delay, wherein the defined amount of delay, i.e. the increment E, M, L, may differ from group to group, and, importantly, is configurable by the individual control parameters, as has been explained previously. It can be seen from FIG. 10 and the description of E, M and L that the basic raster is the length of an interleaving unit, i.e. IU_Len. If an interleaving unit thus has e.g. 20 symbols, every delay E, M, L is an integer multiple of this delay, which corresponds to a length of an interleaving unit IU_Len. The delay corresponding to an entire interleaving unit is given by the period duration of the processing clock multiplied by the number of bits or symbols, wherein the clock is a bit clock in the case of the processing of bits, and wherein the clock is a byte clock in the case of the processing of bytes as symbols.

Subsequently, a particular configuration example will be illustrated.

FEC Parameter

A turbo code corresponding to the 3GPP2 standard is used as FEC encoder.

| | | |
|---|---|---|
| Bits per block at the input of the FEC encoder (including 6 tail bits) | 12288 bits | bits |
| Code rate R | 1/4 | |
| Number of bits at the output of the FEC encoder | 49152 bits | bits |
| Size of an IU | 512 bit | bits |
| Number of the IUs per codeword | 96 | |

Figure 5:
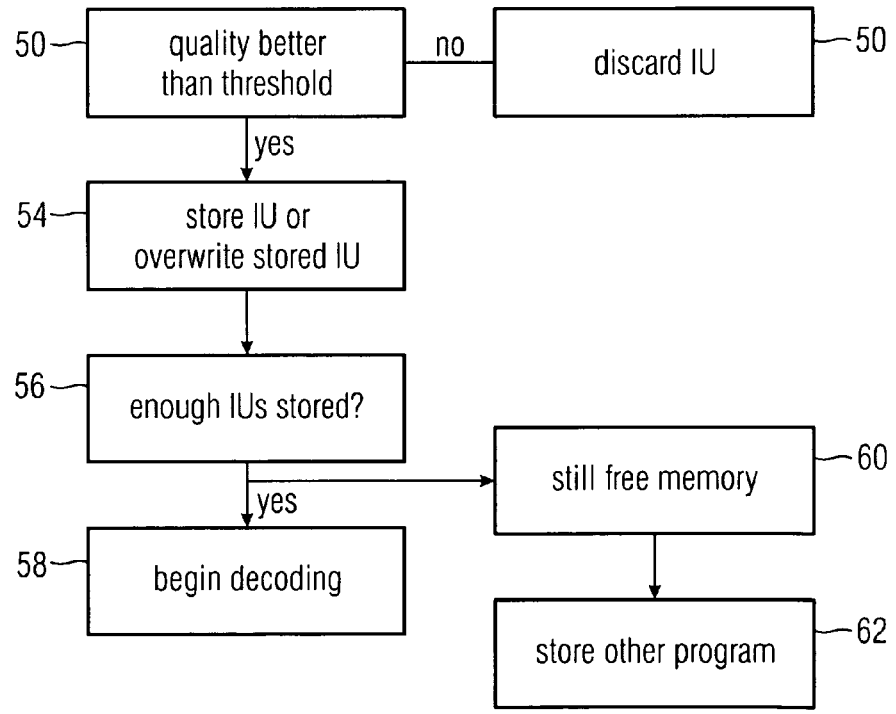
FIG. 5 shows an embodiment of a processor processing routine for increasing receiver efficiency.
Figure 11:
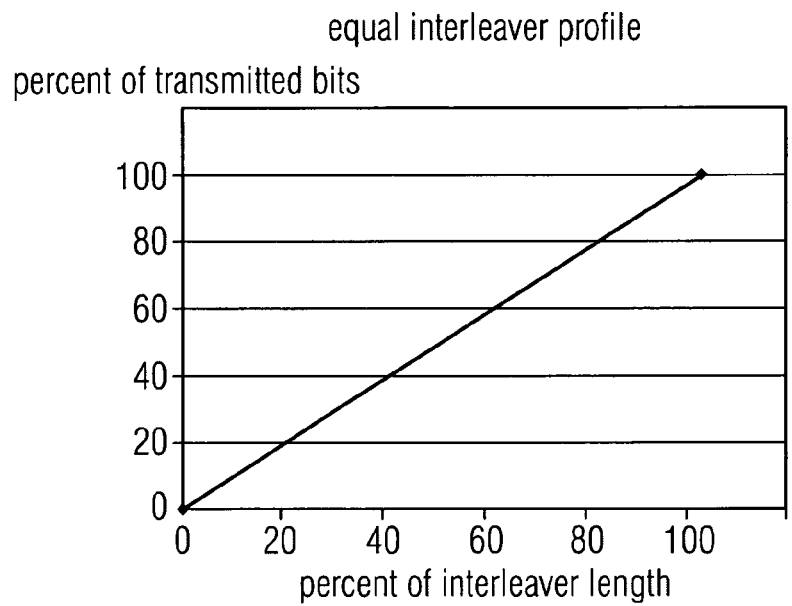
FIG. 11 shows an equal interleaver profile.
Figure 12:
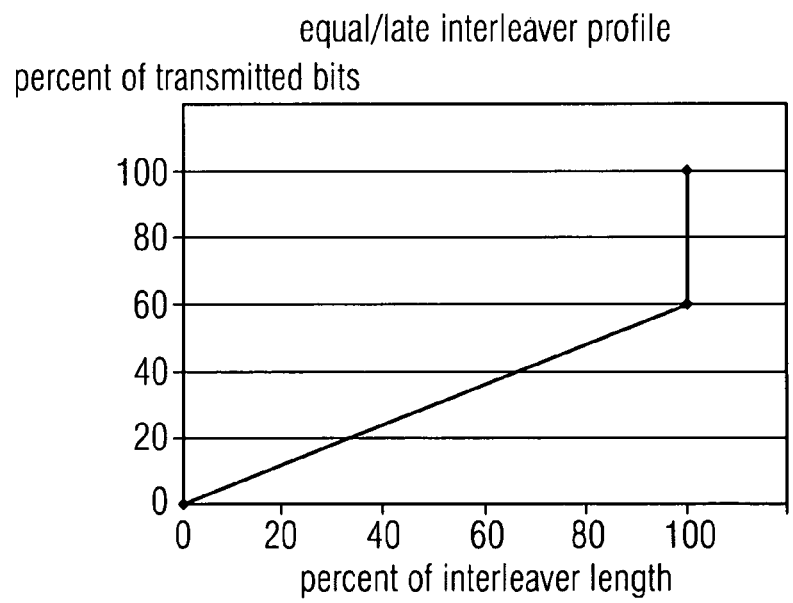
FIG. 12 shows an equal/late interleaver profile suited for a transmission channel with good reception conditions and allowing for short access time (fast access).

Mixer Configuration
    codeWordLen is 49152 bits and CILM_Inc is 217.
Disperser Configuration
    The following sub-chapters show various configurations representing different interleaver profiles, and hence various cases of application.
Equal Spreading (FIG. 11)
    The IUs belonging to one block (or codeword) are distributed equally over time, i.e. the distance between the IUs is the same at the output of the disperser.
    Such a configuration makes sense if the transmission channel produces random brief interruptions (bad channel state) and then more or less randomly disturbs the individual IUs. In particular, this configuration makes sense at higher code rates.
    One possible configuration is to use only the early part, i.e. middleStart=noIlvTaps.
Early/Late
    The IUs of one block are transmitted in two bursts (early and late), between which there is a time interval in which no IUs of this block are transmitted or very rarely are.
    This configuration should be used if the transmission channel produces very long interruptions (e.g. when driving under a bridge or through a tunnel). Here, in the case of good reception, the early or late part has to be sufficient on its own so as to be able to decode the block. If this is the case, the interruption is allowed to be maximally as long as the interval between early and late, without failure occurring in the decoding of this block.
    For parameterization of this configuration, middleStart and noIlvTaps-lateStart (number in early and/or late part) should be greater than lateStart-middleStart (size of the middle part). For a burst-like transmission, earlyTapDiff and lateTapDiff should be chosen at zero, while tapDiffMult and middleTapDiff should be maximal, in order to extend the IUs as far as possible in the middle part.
Equal/Late (FIG. 12)
    Part of the IUs are transmitted in accordance with the strategy of "equal spreading" (see above), the rest comes in burst-like manner as the late part.
    In this case, the late part has to include a sufficient number of IUs, so that it alone is sufficient for error-free decoding, in the case of good reception conditions. Thus, this interleaver profile is suited for fast access, so that the access time can be kept low in spite of a long interleaver. The remaining IUs in the equal part are supposed to offer the protection from random failures of IUs (see "equal spreading").
    The parameterization may take place in similar way to the above for the early, middle and late parts.
Early/Equal
    This configuration is a temporal mirror image of the "equal/late" configuration, i.e. there is a burst-like early part followed by "equal spreading" for the remaining IUs.
    It is the advantage here that the end-to-end delay is small. At the earliest, it may already be decoded after the reception of the early part, which is shortly after the accompanying information has been entered into the transmitter.
    FIG. 5 shows a functional implementation of the receiver arrangement according to the invention. It receives a reception signal with interleaved interleaving units, as output from the multiplexer 32 e.g. from the data stream with the number i in FIG. 3 and input into the de-disperser 34. These interleaved interleaving units are input into an interleaving unit detector 40 formed to receive interleaving units from the signal. The detected interleaving units are needed to correctly control the de-disperser 34. Furthermore, according to the invention, there is disposed a side information estimator 42 either only communicating with the interleaving unit detector 40 or additionally obtaining the reception signal, or which may be controlled by another device, such as a channel estimator. The side information estimator is formed to estimate information for an extracted interleaving unit related to a transmission of the entire interleaving units. The side information estimator 42 and the interleaving unit detector 40 feed a processor 44 for further processing of the interleaving units, using the side information determined for an entire interleaving unit and provided from the block 42. Hence, in the embodiment, the processor 44 combines the functionalities of the de-disperser 34 and the de-mixer 36 of FIG. 3. In embodiments of the present invention, it does, however, include further functionalities to enhance the efficiency of the receiver, as will be explained with reference to FIG. 5.

In particular, the processor 44 then checks, when it has obtained the side information for an interleaving unit, as to whether reception quality better than a threshold is assigned to the interleaving unit (step 50). If this question is answered in the negative, the entire interleaving unit is discarded (step 52), which may for example be implemented, in particular, by storing nothing in a memory, but simply characterizing the discarded interleaving units with erasures, i.e. e.g. with probability information signaling 50% probability for a 0 or a 1, when the de-dispersing is taking place.

If the question in step 50 is answered in the affirmative, however, such an interleaving unit, as set forth in step 54, is stored in a receiver memory implementing the de-disperser functionality 34 by reading from the memory in different way than it has been written to. Yet, if it has already been determined that enough interleaving units of good quality for a codeword have been received, such that correct decoding of the codeword may already be performed without receiving all interleaving units of the codeword, it is checked whether an interleaving unit having worse quality than the interleaving unit presently considered is stored in the receiver memory. If such an interleaving unit is found, it is overwritten with the currently detected, newer, better-quality interleaving unit. If it is determined, however, that all stored interleaving units have better quality, and if it is also determined that enough interleaving units have already been received, the interleaving unit having relatively good quality due to the estimated side information nevertheless is discarded, since it is no longer needed.

In this respect, in a step 56, it is checked whether enough interleaving units are stored, which means whether correct decoding of a codeword can already take place. If this question is answered in the affirmative, the decoding is started in a step 58, i.e., the codeword is supplied to the de-mixer 36 if such a de-mixer is present, or the codeword is directly fed into the FEC decoder 38 if a de-mixer 36 of FIG. 3 is not present, wherein erasures are inserted for interleaving units which have been discarded or no longer stored. If it is determined at the same time in a step 60 that memory is still available, it may already be started, in this receiver memory for improving the time duration occurring in the case of a program switch, to store interleaving units of another program in parallel in the memory (step 62), so that—in the optimal case—the second program is also stored in the memory completely regarding codewords, such that switching from one program to another program is done directly, i.e. without and an end-to-end delay actually given by the long convolution interleaver.

All this becomes possible since it is no longer worked in a simple-wise or bit-wise manner anymore, according to the invention, but it is worked in interleaving-unit-wise manner, so that only quality information has to be processed in interleaving-unit-wise manner. Moreover, a reception memory may be read out in interleaving-unit-wise manner, i.e., in burst-like manner, whereby not only the de-disperser operation is accelerated significantly when using a normal RAM memory, but whereby also read-out enhancement takes place when using any other memory, since adjacent memory addresses can be read out in a burst to acquire the individual symbols present in an interleaving unit, so that the de-disperser operation is executed. Moreover, clear signaling can be maintained, because the number of time information to be managed no longer has to be generated, managed and applied in bit-wise manner, but only in interleaving-unit-wise manner, which contributes to a 128-fold reduction in the information to be managed if an interleaving unit comprises e.g. 128 bits or more. Thus, the accuracy indeed is reduced, since one no longer has quality information per bit, but only per interleaving unit, i.e. in rougher granularity. However, this is not critical, since such exact quality information is not needed and/or such quality information in this fine granularity is not that expressive anyway. According to the invention, the acquisition of quality information therefore is optionally tuned to the interleaver, such that the complexity of the channel estimator may also be reduced equally in the case of reduced complexity, without having to put up with quality losses.

Figure 4:
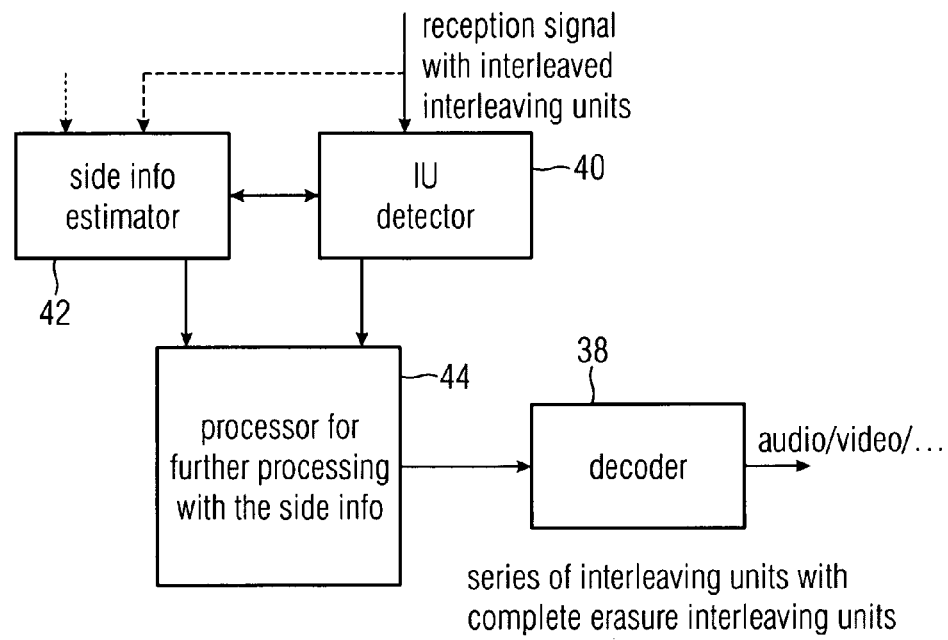
FIG. 4 is a functional illustration of the receiver structure of FIG. 3.

Subsequently, the decoder strategies indicated on the basis of FIG. 4 and FIG. 5 will be detailed. Since the channel state is determined earlier for each IU, this side information in the de-disperser may be used to control the further decoding steps therewith. A memory-optimized implementation may be as follows:

The use of low-rate codes in a time-varying transmission channel enables that only the "good" (little disturbed) IUs have to be stored. IUs with low signal quality do not have to be stored. As an example, the use of a rate ¼ code, the codewords of which consist of 96 Ius, is to be mentioned. In the case of very good reception, about 30% of the IUs are sufficient to be able to decode this code, i.e., the 25% of the code needed for representation of the information in a rate ¼ code plus 5% redundancy so that the decoder can work correctly. If the strategy "only the best IUs are stored" is pursued, the memory needed may be reduced as much as 30%. Correspondingly, not 96 IUs, but only the 30%*96=29 IUs for which the best channel state was estimated are stored for each codeword. If 29 IUs are already stored and another one better than the worst one previously received is received, this bad one is simply replaced by the better one. This is done by a suitable interleaver control unit in the disperser.

A similar strategy is of particular interest in connection with Diversity Combining or in case the multiplexer includes various programs.

Concept 1:

As many IUs as are needed for the decoding are stored by the selected program (see example above).

The rest is used for other programs so that a quick program change becomes possible (see fast access). Thereby, the existing memory is utilized optimally.

Concept 2:

In the case of Diversity Combining, only the good IUs are stored early. Hereby, the memory needed is made smaller.

An alternatively or additionally applied strategy optimized for energy consumption may be as follows:

If enough "good" IUs have been received, the receiver can be switched off. The receiver thus continuously measures the quality of the received IUs. If enough IUs with good signal quality have been received, the remaining ones are no longer needed and can be replaced with "erasure". If e.g. the transmission system is formed so that a certain range (maximum distance between transmitter and receiver) is allowed, all receivers closer to the transmitter receive the data with higher quality. Thus, the receivers no longer need all IUs for error free decoding. If individual IUs are no longer needed, the accompanying parts of the receiver may be switched off briefly again and again. Thereby, the period of operation in portable devices is prolonged, since the mean power consumption is reduced. The management of the data is simplified substantially by the chosen interleaver structure.

A strategy optimized by fast access is served optimally if the interleaver is configured for a strong late part, i.e., if the third group of the disperser of FIG. 10 is weighted strongly.

In the case of a convolution interleaver it is true that the sum of the length of the delay line in the transmitter and in the receiver is equal for all tabs. If the delay line is chosen to be long in the transmitter, the delay line is correspondingly short in the receiver. A long delay line in the transmitter means that the accompanying data are transmitted later (="late"). A short delay line in the receiver means a short delay, however. The accompanying bits thus are available at the output of the de-disperser after a short delay time (=faster access="fast access"). This configuration is particularly advantageous when using a relatively low code rate for the FEC encoder.

In summary, the present invention thus includes an interleaver apparatus implementing the functionality of a convolution interleaver in the interleaving means, which works in interleaving-unit-wise manner, wherein an interleaving unit includes more than one symbol. The number of bits per symbol here corresponds to the symbol length of the FEC encoder.

The inventive interleaver structure therefore has the feature that a codeword is decomposed into a series of smaller data packets, i.e., interleaving units. An interleaving unit includes more than one information symbol and advantageously at least 128 information symbols. These interleaving units are distributed to various connection lines with different delays via a de-multiplexer, wherein the connection lines and/or delay lines have various lengths, or implement various delays in some way, for example by FIFO memories. After the corresponding delay, the output-side multiplexer multiplexes the output of the connection lines into a data stream again, which is then fed to a modulator, in order to finally generate an RF output signal.

In the embodiment, a mixer is connected upstream of the disperser. With this, the disadvantage of the grouping in interleaving units introduced at first sight is compensated for. Yet, particularly for FEC codes, which still have relatively good properties also without a mixer, an implementation capable of doing without the mixer for complexity reasons both on transmitter side and on receiver side also is advantageous.

If the mixer is used, it functions as a block interleaver, which is connected upstream of the interleaving means and re-sorting the data bits or data symbols of a codeword individually, i.e., in a symbol-wise or bit-wise manner.

For improving the decoder functionality, at first the channel state is determined on the decoder side for each interleaving unit. Hereupon, then the series of interleaving units together with the channel state information are brought into the original order via the de-disperser. The output of the de-interleaver, together with the channel state information, then is processed further by the FEC decoder. As explained on the basis of FIG. 10, the disperser is a configurable disperser having several parts the length of which in interleaving units and the temporal extension of which with respect to the delays in the respective parts can be chosen differently depending on the requirement. The configuration of the disperser in three segments, namely an early segment, a middle segment and a late segment, is a special implementation. For certain applications, an early-late configuration or an equal-late configuration may be expedient, wherein a low-rate FEC code and a strong late part are advantageous in the latter configuration to allow for fast access. Alternative configurations are the early/equal configuration or the complementary disperser configuration in the case of transmit diversity. On the decoder side, a decoder algorithm is advantageous, which files interleaving units that are good and needed for the decoding in the memory, while worse ones are replaced with better interleaving units or worse interleaving units are not stored. The interleaving units are not stored either if the channel is better than planned. Unavailable interleaving units here are regarded as "erasures".

The functionality may be used particularly for improved energy management, which is of particular advantage to mobile devices that are battery operated and the activity duration of which may be increased therewith. Particularly when enough good interleaving units have been received, the corresponding receiver part is switched off to save battery current.

Depending on the circumstances, the inventive methods may be implemented in hardware or in software. The implementation may be on a digital storage medium, in particular a disk or CD having electronically readable control signals capable of cooperating with a programmable computer system such that a method will be executed. In general, the invention thus also consists in a computer program product having a program code stored on a machine-readable carrier for performing the method when the computer program product is executed on a computer. In other words, the invention may thus also be realized as a computer program having a program code for performing the method when the computer program is executed on a computer.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. An interleaver apparatus for processing a codeword derived from an input block of symbols using redundancy-adding coding, and comprising more symbols than the input block, wherein the codeword comprises a sequence of interleaving units, wherein each interleaving unit comprises at least two symbols, comprising:
   a block interleaver for changing an order of symbols in the codeword so that an order of symbols as generated by the redundancy-adding coding is changed so as to acquire the codeword comprising the sequence of interleaving units; and
   an interleaver for changing the sequence of interleaving units to acquire an interleaved codeword comprising a changed sequence of interleaving units, wherein the interleaver is formed not to change an order of the symbols within an interleaving unit and to change the sequence so that at least one interleaving unit of a previous or subsequent codeword is arranged between two interleaving units of the codeword.

2. The interleaver apparatus according to claim 1, wherein a size of the interleaving unit is chosen so that the codeword comprises at least four interleaving units, and wherein the interleaver is formed to change the sequence of the at least four interleaving units.

3. The interleaver apparatus according to claim 1, wherein a symbol is a bit and each interleaver comprises at least two bits, or wherein a symbol is a byte and each interleaving unit comprises at least two bytes.

4. The interleaver apparatus according to claim 1, wherein the redundancy-adding coding works in symbol-wise manner to acquire a symbol of the codeword, using a combination of one or more symbols of the input block, so that the codeword is based on a symbol raster, and wherein the interleaver is formed to perform changing the sequence in an interleaving unit raster coarser than the symbol raster.

5. The interleaver apparatus according to claim 1,
   wherein an interleaving unit comprises at least 128 symbols, and
   wherein the interleaver is formed to change the sequence of the interleaving units, each of which comprises at least 128 symbols.

6. The interleaver apparatus according to claim 1, further comprising:
   wherein the interleaver is formed not to change an order of the symbols within an interleaving unit and to change the sequence so that an order of interleaving units in the interleaved codeword is different from an order of the sequence of interleaving units.

7. The interleaver apparatus according to claim 6, wherein the block interleaver is formed to implement the following interleaver rule:

$$b[i]=a[(CILM\_Inc*i) \bmod \text{codewordLen}],$$

wherein b[i] is a symbol at a position i of the codeword at an output of the block interleaver, wherein a[x] is a value of a symbol at a location x of codeword input into the block interleaver, wherein CILM_Inc is an adjustable integer, wherein mod is a modulo operation, and wherein CodewordLen is a length of the codeword.

8. The interleaver apparatus according to claim 7, wherein the block interleaver is configurable to work using a configurable parameter CILM_Inc.

9. The interleaver apparatus according to claim 8, wherein the block interleaver is formed to comprise a configurable parameter dependent on a code rate of the redundancy-adding encoder, wherein the parameter typically is a prime number or a product of prime numbers.

10. The interleaver apparatus according to claim 1, wherein a symbol comprises a bit if the redundancy-adding coding comprises a turbo code, a Viterbi code or an LDPC code, and wherein a symbol comprises a byte if the redundancy-adding coding is Reed-Solomon coding.

11. The interleaver apparatus according to claim 1, wherein the interleaver comprises:
   a plurality of connection lines, wherein each connection line is formed to provide a defined delay, which is different for each connection line, or which is substantially equal to 0 for a connection line;
   an input multiplexer formed to switch, after feeding a number of complete interleaving units into one connection line, to another connection line, wherein the number of complete interleaving units is equal to or greater than 1; and
   an output multiplexer formed to switch, after reception of a number of complete interleaving units from one connection line, to another connection line, wherein the number is equal to or greater than 1.

12. The interleaver apparatus according to claim 11, wherein the plurality of connection lines comprise a first group of connection lines in which each connection line except for a first one is formed to provide a defined first amount of delay or an integer multiple of the defined first amount of delay, and wherein the plurality of connection lines comprise a second group of connection lines, wherein each connection line of the second group is formed to provide the same multiple of the defined first delay as well as a defined second delay different from the defined first delay, or an integer multiple of the defined second delay.

13. The interleaver apparatus according to claim 12, wherein the plurality of connection lines further comprise a third group of connection lines, wherein each connection line of the third group is formed to comprise the same multiple of the defined first delay as well as the same multiple of the defined second delay as well as a defined third delay different from the defined first delay or the defined second delay.

14. The interleaver apparatus according to claim 13, wherein the third group of connection lines is formed to configure the defined third amount of delay in integer multiples of an interleaving unit.

15. The interleaver apparatus according to claim 12, wherein the defined first amount of delay or the defined second amount of delay are configurable using a configuration parameter allowing for configuration in integer multiples of an interleaving unit.

16. The interleaver apparatus according to claim 1, wherein the interleaver is configured to interleave so that the interleaving units of a codeword are sent uniformly over time to achieve an equal spreading profile.

17. The interleaver apparatus according to claim 1, wherein the interleaver is configured to interleave so that the interleaving units of a codeword are transmitted more strongly in a first or a third time interval than in a second time interval lying between the first and the third time intervals, in which less or no interleaving units are transmitted as compared with the first and third time intervals, in order to achieve an early-late spreading profile.

18. The interleaver apparatus according to claim 1, wherein the interleaver is configured to interleave so that part of the interleaving units are transmitted in uniformly distributed way over time and a remaining part of the interleaving units are transmitted in burst-like manner in an ensuing time interval in which more interleaving units per time unit are transmitted than in the first time interval, in order to achieve an equal-late spreading profile.

19. The interleaver apparatus according to claim 1, wherein the interleaver is formed to interleave so that a number of interleaving units are transmitted in burst-like manner in a first time interval, and that a remaining part of the interleaving units of a codeword are transmitted in an ensuing longer time interval, wherein more interleaving units per time unit are transmitted in the first time interval than in the ensuing time interval, in order to acquire an early-equal spreading profile.

20. The interleaver apparatus according to claim 1, wherein the interleaver is configurable, and wherein configuration parameters are introduced into a transmission signal so as to be detected by a receiver.

21. A transmitter for generating a transmission signal, comprising:

a redundancy-adding encoder with a code rate smaller than 1, which is formed to generate, from an input block of signals, a codeword comprising a number of symbols greater than a number of symbols of the input block;

an interleaver for changing the sequence of interleaving units to acquire an interleaved codeword comprising a changed sequence of interleaving units, wherein the interleaver is formed not to change an order of the symbols within an interleaving unit and to change the sequence so that at least one interleaving unit of a previous or subsequent codeword is arranged between two interleaving units of the codeword; and a modulator for modulating a data stream output from the interleaver onto a transmission channel.

22. A method of processing a codeword derived from an input block of signals using redundancy-adding coding, and comprising more symbols than the input block, wherein the codeword comprises a sequence of interleaving units, wherein each interleaving unit comprises at least two symbols, comprising:

changing an order of symbols in the codeword so that an order of symbols as generated by the redundancy-adding coding is changed so as to acquire the codeword comprising the sequence of interleaving units; and changing the sequence of interleaving units to acquire an interleaved codeword comprising a changed sequence of interleaving units, wherein changing is performed so that an order of the symbols within an interleaving unit is not changed and the sequence is changed so that at least one interleaving unit of a preceding or subsequent codeword is arranged between two interleaving units of the codeword.

23. A receiver for receiving a signal derived from a block of symbols using redundancy-adding coding, and based on a codeword comprising a sequence of interleaving units, wherein the sequence of interleaving units has been changed, wherein an order of symbols in the codeword as generated by the redundancy-adding coding has been changed, further wherein an order of the symbols within an interleaving unit has not been changed, and wherein at least one interleaving unit of a previous or subsequent codeword is arranged between two interleaving units of the codeword, comprising:

a detector for detecting interleaving units from the signal;

a side information estimator for estimating side information for an interleaving unit related to a transmission of the entire interleaving unit; and a processor for processing the interleaving unit further based on the side information determined for the respective entire interleaving unit.

24. The receiver according to claim 23, wherein the side information estimator is formed to estimate reception quality information for the interleaving unit, and wherein the processor is formed to either store the entire interleaving unit on the basis of the side information completely for further processing or ignore same completely for the further processing.

25. The receiver according to claim 24, wherein the signal comprises a plurality of programs, and wherein the processor is formed to store, if enough interleaving units for a codeword of a selected program have already been stored and if free memory still is available, interleaving units of another program, but not store interleaving units of the codeword of the selected program.

26. The receiver according to claim 24, wherein the processor is formed to place the receiver into an energy saving mode if enough interleaving units for correct decoding of a code are stored.

27. The receiver according to claim 24, wherein the processor is formed to store an interleaving unit for further processing if the side information indicates reception quality higher than a threshold.

28. The receiver according to claim 24, wherein the processor is formed to store an interleaving unit for further processing if the processor has determined that not enough interleaving units for decoding at a certain error rate are stored for a codeword yet.

29. The receiver according to claim 28, wherein the processor is formed to overwrite the already stored interleaving unit of worse reception quality in a memory, if enough interleaving units for a codeword are already stored and if side information indicating better reception quality for the interleaving unit than a reception quality already stored has been estimated for an interleaver.

30. The receiver according to claim 23, wherein the signal is interleaved such that a late time duration exists, in which more interleaving units of a codeword are comprised than in another time duration of a transmission, and
 wherein the processor comprises a fast-access functionality in order to begin decoding of the codeword already on the basis of the interleaving units found from the late time interval, without waiting for interleaving units from the other time interval.

31. The receiver according to claim 23, wherein the signal goes back to a coding at a code rate equal to or smaller than 0.5, and wherein a late time interval comprises a proportion of interleaving units so great that the number of interleaving units in the late time interval is already sufficient for decoding at a certain error rate in the case of a certain channel quality.

32. A method of receiving a signal derived from a block of symbols using a redundancy-adding coding, and based on a codeword comprising a sequence of interleaving units, wherein the sequence of interleaving units has been changed, wherein an order of symbols in the codeword as generated by the redundancy-adding coding has been changed, further wherein an order of the symbols within an interleaving unit has not been changed, and wherein at least one interleaving unit of a previous or subsequent codeword is arranged between two interleaving units of the codeword, comprising:
 detecting interleaving units from the signal;
 estimating side information for an interleaving unit related to a transmission of the entire interleaving unit; and
 further processing the interleaving unit on the basis of the side information determined for the respective entire interleaving unit.

33. A computer readable medium storing a computer program with a program code for performing, when the computer program is executed on a computer, a method of processing a codeword derived from an input block of signals using redundancy-adding coding, and comprising more symbols than the input block, wherein the codeword comprises a sequence of interleaving units, wherein each interleaving unit comprises at least two symbols, the method comprising:
 changing an order of symbols in the codeword so that an order of symbols as generated by the redundancy-adding coding is changed so as to acquire the codeword comprising the sequence of interleaving units; and
 changing the sequence of interleaving units to acquire an interleaved codeword comprising a changed sequence of interleaving units, wherein changing is performed so that an order of the symbols within an interleaving unit is not changed and the sequence is changed so that at least one interleaving unit of a preceding or subsequent codeword is arranged between two interleaving units of the codeword.

34. A computer readable medium storing a computer program with a program code for performing, when the computer program is executed on a computer, a method of receiving a signal derived from a block of symbols using a redundancy-adding coding, and based on a codeword comprising a sequence of interleaving units, wherein the sequence of interleaving units has been changed, wherein an order of symbols in the codeword as generated by the redundancy-adding coding has been changed, further wherein an order of the symbols within an interleaving unit has not been changed, and wherein at least one interleaving unit of a previous or subsequent codeword is arranged between two interleaving units of the codeword, the method comprising:
 detecting interleaving units from the signal;
 estimating side information for an interleaving unit related to a transmission of the entire interleaving unit; and
 further processing the interleaving unit on the basis of the side information determined for the respective entire interleaving unit.

* * * * *